(12) United States Patent
Keirn

(10) Patent No.: US 6,236,692 B1
(45) Date of Patent: May 22, 2001

(54) READ CHANNEL FOR INCREASING DENSITY IN REMOVABLE DISK STORAGE DEVICES

(75) Inventor: Zachary A. Keirn, Loveland, CO (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/112,550

(22) Filed: Jul. 9, 1998

(51) Int. Cl.$^7$ ..................................................... H03D 1/00
(52) U.S. Cl. ........................... 375/341; 714/795; 714/796
(58) Field of Search .................................. 375/341, 290, 375/262; 714/794, 795, 796

(56) References Cited

U.S. PATENT DOCUMENTS

| | | |
|---|---|---|
| 5,208,816 | 5/1993 | Seshardi et al. . |
| 5,272,706 | 12/1993 | Park . |
| 5,768,320 | * 6/1998 | Kovacs et al. ..................... 375/341 |
| 5,914,989 | * 6/1999 | Thapar et al. ..................... 375/341 |

OTHER PUBLICATIONS

"A 500MHz PRML Write Channel with Dual Level 45 Percent Write Precompensation including Metastability Insensitive Asynchronous Clock Generation," by Jack R. Knutson and Fulvio Spagna.

* cited by examiner

Primary Examiner—Temesghen Ghebretinsae
(74) Attorney, Agent, or Firm—W. Daniel Swayze, Jr.; W. James Brady; Frederick J. Telecky, Jr.

(57) ABSTRACT

A circuit to process a coded information sequence received from a transmitter, by determining a value for a metric indicative of the relative quality for each of best candidates to be selected as the sequence is actually transmitted, selecting if said coded information sequence is to be decoded in accordance with either $E^2$ PR4 (1,k) or in accordance with EPR4 (0,k); and, using a common trellis to share circuitry between the $E^2$PR4 (1,k) and EPR4 (0,k) detectors to reduce overall complexity.

1 Claim, 4 Drawing Sheets

FIG. 4A

| STATE METRIC UPDATE EQUATIONS | |
|---|---|
| $E^2PR4(1,7)$ | $EPR4(0,k)$ |
| $M_k(S0)=\min(m_{50},m_{00})-4000$ | $M_k(S0)=\min(m_{50},m_{00})-4000$ |
| $M_k(S1)=\min(m_{01},m_{51})-4000$ | $M_k(S1)=\min(m_{01},m_{51})-4000$ |
| $M_k(S2)=\min(m_{12},m_{62})-4000$ | $M_k(S2)=\min(m_{12},m_{62})-4000$ |
| $M_k(S3)=m_{23}$ | |
| $M_k(S4)=m_{24}$ | $M_k(S4)=\min(m_{14},m_{64})$ |
| $M_k(S5)=m_{75}$ | $M_k(S5)=\min(m_{25},m_{75})$ |
| $M_k(S6)=m_{76}$ | $M_k(S6)=\min(m_{26},m_{76})$ |
| $M_k(S7)=\min(m_{37},m_{87})$ | $M_k(S7)=\min(m_{47},m_{97})$ |
| $M_k(S8)=\min(m_{48},m_{98})$ | |
| $M_k(S9)=\min(m_{49},m_{99})-40000$ | $M_k(S9)=\min(m_{49},m_{99})-4000$ |

FIG. 4B

| PATH METRIC UPDATE EQUATIONS | |
|---|---|
| $E^2PR4(1,7)$ | $EPR4(0,k)$ |
| $m_{00} = M_{k-1}(S0) + (y_k - 0)^2 - 4002$ | $m_{00} = M_{k-1}(S0) + (y_k - 0)^2 - 4002$ |
| $m_{50} = M_{k-1}(S5) + (y_k + 1)^2 - 4004$ | $m_{50} = M_{k-1}(S5) + (y_k + 1)^2 - 4004$ |
| $m_{01} = M_{k-1}(S0) + (y_k - 1)^2 - 4004$ | $m_{01} = M_{k-1}(S0) + (y_k - 1)^2 - 4004$ |
| $m_{51} = M_{k-1}(S5) + (y_k - 0)^2 - 4002$ | $m_{51} = M_{k-1}(S5) + (y_k - 0)^2 - 4002$ |
| $m_{12} = M_{k-1}(S1) + (y_k - 3)^2 - 4004$ | $m_{12} = M_{k-1}(S1) + (y_k - 1)^2 - 4004$ |
| $m_{62} = M_{k-1}(S6) + (y_k - 2)^2 - 4004$ | $m_{62} = M_{k-1}(S6) + (y_k - 0)^2 - 4004$ |
| $m_{23} = M_{k-1}(S2) + (y_k - 2)^2 - 4004$ | $m_{25} = M_{k-1}(S2) + (y_k + 1)^2 - 4004$ |
| $m_{24} = M_{k-1}(S2) + (y_k - 3)^2 - 4004$ | $m_{26} = M_{k-1}(S2) + (y_k - 0)^2 - 4004$ |
| $m_{37} = M_{k-1}(S3) + (y_k + 2)^2$ | $m_{14} = M_{k-1}(S1) + (y_k - 2)^2$ |
| $m_{75} = M_{k-1}(S7) + (y_k + 3)^2 - 4002$ | $m_{75} = M_{k-1}(S7) + (y_k + 2)^2$ *SAME MAX -4002 |
| $m_{87} = M_{k-1}(S8) + (y_k + 3)^2$ | $m_{64} = M_{k-1}(S6) + (y_k - 1)^2$ |
| $m_{76} = M_{k-1}(S7) + (y_k + 2)^2 - 4004$ | $m_{76} = M_{k-1}(S7) + (y_k + 1)^2 - 4004$ |
| $m_{48} = M_{k-1}(S4) + (y_k - 0)^2 - 4002$ | $m_{47} = M_{k-1}(S4) + (y_k - 0)^2 - 4002$ |
| $m_{98} = M_{k-1}(S9) + (y_k + 1)^2 - 4004$ | $m_{97} = M_{k-1}(S9) + (y_k + 1)^2 - 4004$ |
| $m_{49} = M_{k-1}(S4) + (y_k - 1)^2 - 4004$ | $m_{49} = M_{k-1}(S4) + (y_k - 1)^2 - 4004$ |
| $m_{99} = M_{k-1}(S9) + (y_k - 0)^2 - 4002$ | $m_{99} = M_{k-1}(S9) + (y_k - 0)^2 - 4002$ |

READ CHANNEL FOR INCREASING DENSITY IN REMOVABLE DISK STORAGE DEVICES

FIELD OF THE INVENTION

The present invention relates to the field of signal processing and in particular to the field of signal processing in partial-response (PRML) read-channel.

BACKGROUND OF THE INVENTION

Communication of voice and data signals is often accomplished by converting analog signals to digital signals. These digital signals are then transmitted from a transmitting device to a receiving signal, converted back to analog, if necessary, and communicated to a user. This digital transmission is often performed through analog channels. Digital information is transmitted in the form of a "symbol" representing a digital value. In some cases, adjacent symbols can overlap, resulting in a phenomenon known as intersymbol interference. This interference can corrupt a digital transmission, leading to errors in the receipt of the digital information.

In a magnetic recording channel, a method for decoding the binary symbol sequence that is outputted from the channel in its corrupted form is required. Maximum-likelihood sequence estimation (MLSE) decoding has been employed in the past as an effective tool in pulse detectors for receiving and decoding digital transmissions that suffer from intersymbol interference.

The use of partial response signaling allows a better handling of intersymbol interference and allows a more efficient utilization of the bandwidth of a given channel. In partial response systems, a controlled amount of intersymbol interference can be allowed. The partial response system may be described by the polynomials (1+D), (1−D) and (1−$D^2$) also called duobinary, dicode and class IV, respectively. A general polynomial that is most often applied to magnetic recording is (1−D) (1+D)$^n$, where n=1 is PR4 or Class IV, n=2 is EPR 4 (Extended PR4), and n=3 is $E^2$PR4. Higher values of n may also be used.

Class IV partial response waveforms are formed by the subtraction of binary waveforms at two bit intervals apart. This process boosts mid-band frequencies making the system more immune to noise and distortion in both high and low frequencies. This is especially useful in a magnetic recording channel where using a conventional inductive head, there is a little signal of low frequencies, and spacing losses can cause a large attenuation at high frequencies.

Because Class IV partial response signaling for digital detection is especially suited for the magnetic recording channel, sampled amplitude detection can be applied for magnetic recording. To minimize the propagation of data errors, the signal is turned into a sequence of binary numbers. Procedures for determining the maximum-likelihood sequence in the presence of noise can then be applied. With sequence detection, sequences of bits are detected and processed to minimize error.

Maximum likelihood sequence estimation, in particular, the Viterbi Algorithm, is used improving the detection of symbol (pulse) sequences in the presence of noise and intersymbol interference. MLSE is described by G. D. Forney in "The Viterbi Algorithm", proceedings of the IEEE, Vol. 61, No. 3, March, 1973 pages 268–278 and by R. W. Wood, etc. in "Viterbi detection of Class IV Partial Response on a Magnetic Recording Channel," IEEE transactions on communication, Vol. COM-34, No. 5, May, 1986, pages 454–461. (Herein incorporated by reference in their entirety).

One of the earliest references (Kobayashi, "Application of Probabilistic Decoding to Digital Magnetic Recording Systems", IBM Journal of Research and Development, Vol. 15, No. 1, January 1971, Pages 64–74. (Incorporated by references in its entirety), to the use of Viterbi algorithm on the intersymbol interference problem was related to Class IV partial response on the magnetic recording channel. In essence, the algorithm provides an iterative method of determining the "best" route of branches along a trellis. If, for each branch, a "metric" is calculated which corresponds to the logarithm of the probability of that branch, then the Viterbi algorithm can be used to determine the branch which accumulates the highest log probability, for example, the maximum-likelihood sequence. Note that in practical implementations of the Viterbi algorithm, accumulated squared error is often used in place of accumulated log likelihood. Thus, the branch with the minimum squared error is chosen as the maximum-likelihood sequence. In essence, given a received sequence, ($a_N$) where "$N$" is an integer time index, choose from all possible transmitted sequences ($b_N$) the one which is most likely to cause ($a_N$) to be received, for example, choose ($b_N$) to maximize P (($a_n$)/($b_N$)).

With the Viterbi algorithm, data is not decoded as soon as it is received. Instead, a sequence of data, having a predetermined coding depth following the digit to be decoded, is first collected. Then, by computing the path metrics, a limited number of possible messages are selected, each extending throughout the decoding depth far beyond the digit presently to be decoded with only one such survivor sequence ending in each of the data states. The correlation between each survivor sequence and the data actually received is computed for the entire decoding depth under consideration. The highest correlation of the survivor sequence is selected to be the sole survivor sequence. The earliest of the received digital digits within the decoding depth is then permanently decoded under the temporary assumption that the sole survivor sequence is the correct sequence.

The MLSE problem is similar to the problem of finding the shortest route through a certain graph. The Viterbi Algorithm arises as a natural recursive solution. This algorithm is also associated with a state diagram which can be illustrated by a trellis such as illustrated in FIG. 1. In a two-state trellis, each node represents a distinct state at a given time and each branch represents a transition to some new state at the next instant of time.

For the two-state trellis shown in FIG. 1, the upper branches and nodes represent the S0 or State 0 path, and the lower state branches and nodes represent the S1 or State 1 path. The diagonal branches represent a path that changes state. The state metrics (the accumulated squared errors) at time K are only a function of the state metrics at (K−1) and the path metrics. State metric update equations are given in Equations 1 and 2.

$M_K(S0) = \min(m_{00}, m_{10})$  Equation 1

$M_K(S1) = \min(m_{01}, m_{11})$  Equation 2 where the path metrics $m_{xx}$ are defined as $m_{00} = M_{k-1}(S0) + (Y_k - T_{00})^2$
$m_{10} = M_{k-1}(S1) + (Y_k - T_{10})^2$
$M_{01} = M_k(S0) + (Y_k - T_{01})^2$
$m_{11} = M_k(S1) + (Y_k - T_{11})^2$ $Y_K$=signal amplitude at time=K $T_{ab}$=expected or target signal amplitude associated with the branch from State a to State b. These values may be fixed or programmable. The quantity $(Y_k-T_{ab})^2$ is known as the branch metric.

Partial response Class IV waveforms can be considered as two independent interleaved Dicodes (1−D) sequences, and each sequence can be decoded independently. In his paper entitled "Optimal Reception for Binary Partial Response Channels," in Bell System Technical Journey, Vol. 51, No. 2 pages 493–505, published in February 1972, incorporated by reference, M. J. Ferguson proposes a simplified method for viterbi detection for binary partial response channels for example 1−−D. Straightforward Viterbi detection needs to keep track of both probabilities going into the two-states, and the ranges of the probabilities are not bounded. Ferguson's method only needs to keep track of the difference between the two probabilities and the value of the differences as well bounded. Assuming $\Delta_K$ is a difference between the two probabilities in Equation 1 and Equation 2 at time K, $Y_K$ is the received signal value and V T (from Equation 2 above) equals 1.

$$\Delta_{K+1} = \begin{cases} y_k+1, & \text{if } \Delta_K - y_K > 1 \\ & \text{("−" transition, "+" merge)} \\ \Delta_K, & \text{if } -1 < \Delta_K - y_K < 1 \\ & \text{(no transition no merge)} \\ y_k-1, & \text{if } \Delta_K - y_K < -1 \\ & \text{("+" transition, "−" merge)} \end{cases} \quad \text{Equation 3}$$

Two prior art examples of applying the Viterbi algorithm for decoding magnetic recording channel outputs are U.S. Pat. No. 4,644,564 by Dolivo et al. And U.S. Pat. No. 4,087,787 by Acampora. Dolivo et al, discloses a method that uses two survivor sequences and the difference metric between the two metrics is processed. In Dolivo et al., as each sample is received, the prior art patent recursively determines the new pair of survivor sequences and the new difference metric. Dolivo et al, is implemented in a digital format that suffers in terms of speed and requires more electronics to implement. Furthermore resetting of the voltage signals do not occur automatically as is desired.

A large number of channels use an $E^2$ PR4 (1,k) detector and a corresponding $E^2$ PR4 (1,k) trellis. Many applications of these channels ($E^2$ PR4 (1,k)) are found in removable disk storage devices. Removable disk storage devices also often use peak detection with a (1,k) code. For higher density disc drive systems, it is desirable to use an E PR4 (0,k ) detector. Removable storage devices often require backward compatibility which prevents changing the detector and/or the modulation code used in future drives. In the past there was no way to combine these two detectors so that backward compatibility for the (1,k) systems could be satisfied by the $E^2$ PR4 (1,k) detector and future higher density systems, which may use the E PR4(0,k) detector. While it is recognized that a EPR4 (1−D) (1+D)$^2$ for (0,K) detector is desirable for higher density future disc drive systems, there has been no way of combining these two types of trellises in the prior art.

BRIEF DESCRIPTION OF THE DRAWINGS

FIG. 4 illustrates the state metric update function as well as the path metric update functions.

SUMMARY OF THE INVENTION

The present invention combines an $E^2$PR4 (1,k) trellis with a EPR 4 (0,k) trellis to form a dual detector which shares the common elements of these two trellises. The present invention allows the detection of data which is in the (1,k) format to be read with the $E^2$ PR4 (1,k) trellis. This would include (1,k) peak detection data as well as $E^2$ PR4 (1,k) data. The invention also provides an EPR4 (0,k) channel for applications requiring higher density. Thus, a channel can be used to read data which is appropriate for the $E^2$ PR4 (1,k) trellis detector or data appropriate for the EPR4 (0,k) detector. Thus, the present invention is a dual detector or a switchable detector whose complexity of the resultant trellis is reduced because of shared states between the $E^2$ PR4 (1,k) trellis detector or the EPR 4 (0,k) trellis detector. Both share states and share state-path metrics. A removable storage device currently using a (1,k) format could use this dual detector to read old format (1,k) disks, while allowing the product to write and read new format (0,k) disks at higher densities.

DETAILED DESCRIPTION OF THE PRESENT INVENTION

Figure 1:
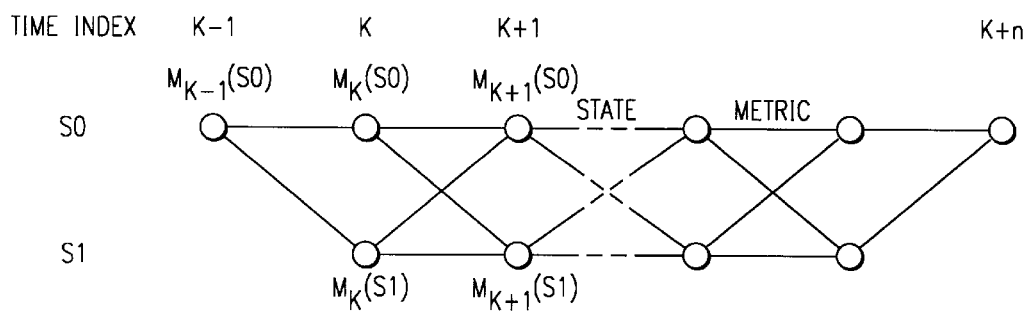
FIG. 1 illustrates an illustration of a two-state trellis representation of the Viterbi algorithm.
Figure 2:
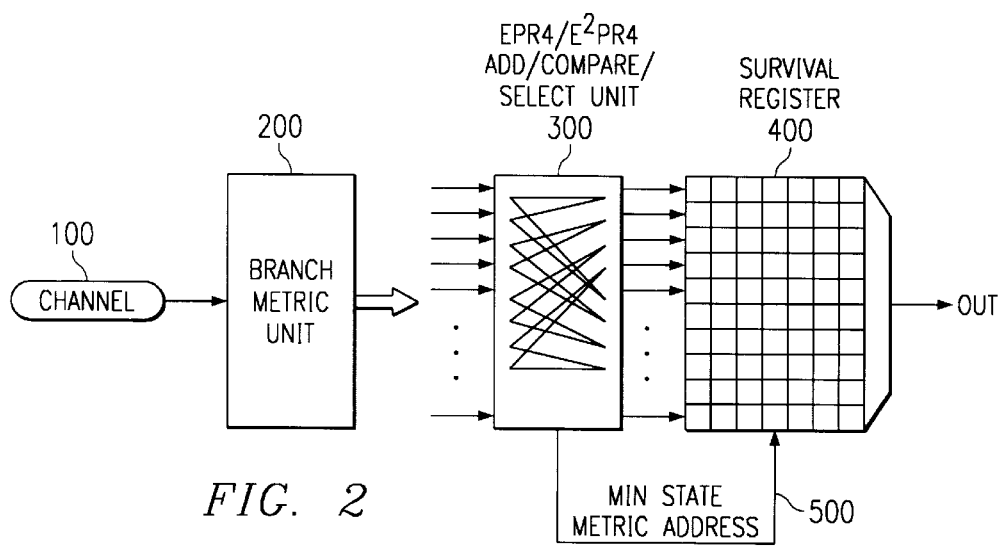
FIG. 2 illustrates an illustration of a block diagram of a Viterbi decoder.

As illustrated in FIG. 2, the channel 100 is connected to the branch metric unit 200. The output from the channel 100 is the sampled data signal. The branch metric unit 200 compares the received data signal to the EPR4 or $E^2$PR4 target values and calculates branch metrics. There are 16 branch metrics calculated for EPR4 or for $E^2$PR4. The target levels for each detector are shown in the path metric equations in FIG. 4 Table II. The branch metrics are combined with the previous state metrics to calculate the path metrics which are compared and the most likely one chosen in the Add/Compare/Select (ACS) unit 300. The ACS unit 300 results are used as inputs to a sequence survival register (SSR) 400. The SSR 400 stores the most likely state information and maintains the bit sequences for each state as it is updated. The output (OUT) is selected from the most likely path metric using the minimum state metric address 500 from the ACS 300 to select the most likely sequence. The path memory of the survival register is optimized by selecting the output from the most likely path.

As it is well known, the operation of conventional coders can be completely described in terms of either a trellis diagram or a state diagram or a table. See Digital Communications, 1993 McGraw-Hill, New York, pages 258–275 J. G. Proakis (Incorporated by reference in its entirety).

Figure 3:
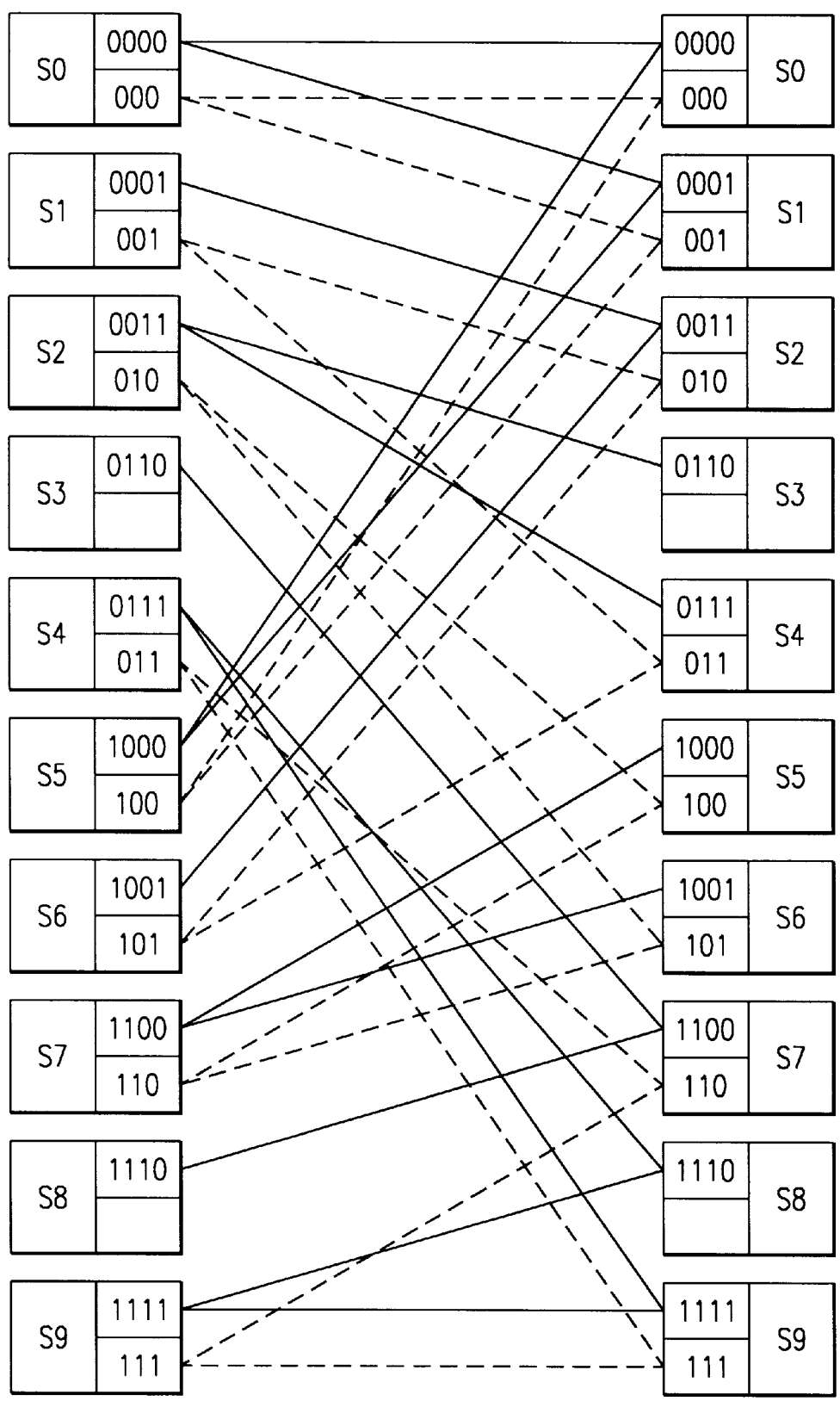
FIG. 3 illustrates a trellis structure of the combined detectors.

FIG. 3 illustrates a trellis structure that was attained by combining a $E^2$ PR4(1,7) trellis having 10 states with a E PR4 (0,k) trellis with 8 states. This trellis of structure of FIG. 3 was obtained by combining state metric and path metrics updates. The states are numbered 0 through 9 for a total of 10 states. The E PR4 (0,k) trellis uses all the states except state 3 and state 8. The branches for the $E^2$ PR4 (1,k) are illustrated as solid lines while the branches for the EP R4 (0,k) are shown by dash lines. The binary NRZ value is shown for each state with the $E^2$ PR4 (1,k)4 bit value shown on top and the 3 bit binary value for E PR4 (0,k) on the bottom. Table 1 shown in FIG. 4 illustrates the state metric update equations for the trellis illustrated in FIG. 3. The state metric equations that are the same for both detectors are illustrated by element 4000. For each trellis, there are 4 state metric equations that are the same as the other trellis.

The path metric update equations are shown in Table II. There are 4 out of 16 path metric updates that are identical shown by element 4002. Additionally, assuming that the max A/D target values are the same, there is an additional 1 that is identical, shown by element 4003. Furthermore, element 4004 illustrates 9 path metric updates which are the same except for the target value. To allow more circuitry to be shared, the target value could be switched in via a mux circuit. Thus, in conclusion, there are 14 out of 16 possible path metric updates that can be done with shared circuitry.

The detector is designed to operate in one of two modes: E PR4 (0,k) or $E^2$ PR4 (1,k). The user would program a register setting in the channel to select which type of detector to use. The channel would make the appropriate state metric and path metric calculations to implement the selected detector.

It is in this way that same trellis which has shared states as illustrated in FIGS. 3 and 4 can be employed.

What is claimed is:

1. A method to process a coded information sequence received from a transmitter, comprising the steps of:

determining a value for a metric indicative of the relative quality for each of best candidates to be selected as the sequence is actually transmitted;

switching between decoding in accordance with either $E^2$ PR4 (1,k) or decoding in accordance with E PR4 (0,k); and using a common trellis to share states between the E PR4 (0, k) and $E^2$PR4 (1, k) detectors to reduce overall complexity for decoding in accordance with said $E^2$PR4 (l, k) or in accordance with said E PR4 (0, k).

* * * * *